(12) United States Patent
Wong et al.

(10) Patent No.: US 7,313,025 B1
(45) Date of Patent: Dec. 25, 2007

(54) FLASH MEMORY ERASE VERIFICATION SYSTEMS AND METHODS

(75) Inventors: Hok Wong, Sunnyvale, CA (US); Fabiano Fontana, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/675,246

(22) Filed: Feb. 15, 2007

Related U.S. Application Data

(63) Continuation of application No. 11/201,620, filed on Aug. 11, 2005, now Pat. No. 7,187,586.

(51) Int. Cl.
*G11C 16/06* (2006.01)

(52) U.S. Cl. .......................... 365/185.22; 365/185.05; 365/185.33

(58) Field of Classification Search ........... 365/185.05, 365/185.21, 185.22, 185.23, 185.33, 189.02, 365/230.02
See application file for complete search history.

(56) References Cited

U.S. PATENT DOCUMENTS

| | | | | |
|---|---|---|---|---|
| 5,239,505 A | * | 8/1993 | Fazio et al. | 365/185.11 |
| 6,477,090 B2 | * | 11/2002 | Yamaki et al. | 365/189.09 |
| 6,807,096 B2 | * | 10/2004 | Toda | 365/185.03 |

* cited by examiner

*Primary Examiner*—Gene N. Auduong

(57) ABSTRACT

Systems and methods are disclosed herein to provide improved verification of flash memory erasure. For example, in accordance with an embodiment of the present invention, an integrated circuit includes an array of flash memory cells. A plurality of sense amplifiers are also provided wherein each sense amplifier is associated with a plurality of the flash memory cells and adapted to detect a state of one of the associated flash memory cells selected from the plurality of flash memory cells. A first logic circuit is also provided to receive the states of the selected flash memory cells from the sense amplifiers and perform a first logic operation at approximately the same time on the states to verify that all states of the selected flash memory cells correspond to an erased state.

16 Claims, 3 Drawing Sheets

Part of a NOR structure to determine if there is any bit not in erased state

FLASH MEMORY ERASE VERIFICATION SYSTEMS AND METHODS

RELATED APPLICATION DATA

This application is a continuation of U.S. application Ser. No. 11/201,620, filed Aug. 11, 2005, now U.S. Pat. No. 7,187,586.

TECHNICAL FIELD

The present invention relates generally to electrical circuits and, more particularly, to flash memory.

BACKGROUND

Flash memory cells are used in connection with a variety of modern technologies such as programmable logic devices, standalone memory cards and drives, embedded systems, and other products. As is well known, flash memory cells generally provide the advantage of maintaining non-volatile storage of programmed data for extended periods of time.

Before flash memory cells can be programmed, however, they normally must be erased to ensure that individual flash memory cells are not left in a programmed state with bit values that are no longer valid. Such erasures are typically performed on entire blocks of flash memory containing many individual flash memory cells. After a block of flash memory has been erased, the state of individual flash memory cells must be checked to confirm that each flash memory cell is in an erased state. If this verification process is not performed, unerased preprogrammed bits may introduce errors in future programming of the flash memory.

In conventional flash memory implementations, the erasure of each flash memory cell is determined in a "bit-by-bit" fashion by consecutively reading the state of the individual flash memory cells. Unfortunately, such conventional flash memory implementations can require a large amount of time to verify the erasure of every individual flash memory cell in a given flash memory block. Such bit-by-bit processes can become especially time-consuming for modern devices employing large numbers of flash memory cells. As a result, there is a need for an improved approach to erase verification of flash memory cells that reduces the performance-limiting delays associated with existing bit-by-bit approaches.

SUMMARY

In accordance with one embodiment of the present invention, an integrated circuit includes an array of flash memory cells; a plurality of sense amplifiers, each sense amplifier associated with a plurality of the flash memory cells and adapted to detect a state of at least one of the associated flash memory cells selected from the plurality of flash memory cells; and a first logic circuit adapted to receive the states of the selected flash memory cells from the sense amplifiers and perform a first logic operation on the states to verify that all states of the selected flash memory cells correspond to an erased state.

In accordance with another embodiment of the present invention, an integrated circuit includes an array of flash memory cells; means for selecting a plurality of the flash memory cells; means for detecting a state of each flash memory cell in the selected plurality of flash memory cells; and means for verifying the state of each flash memory cell in the plurality of flash memory cells to determine that the states correspond to an erased state.

In accordance with another embodiment of the present invention, a method for verifying erasure of a plurality of flash memory cells configured in an array of rows and columns in an integrated circuit includes selecting a number of the flash memory cells; detecting a state of each of the selected number of flash memory cells; and verifying that all of the states of the flash memory cells of the selected number of flash memory cells correspond to an erased state.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits (e.g., a flash memory device or flash memory embedded within an integrated circuit) and applications. As an exemplary implementation, a memory within a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits and within the various types of integrated circuits. Therefore, the techniques may be applied to circuits other than memory and to integrated circuits other than PLDs.

Figure 1:
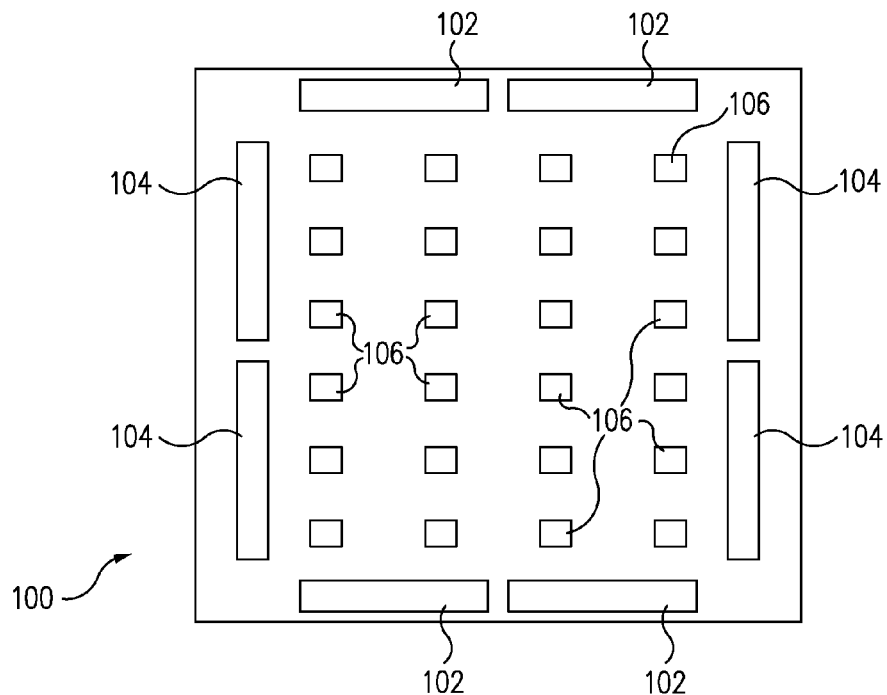
FIG. 1 illustrates a block diagram of an integrated circuit in accordance with an embodiment of the present invention.

FIG. 1 illustrates a block diagram of an integrated circuit in accordance with an embodiment of the present invention. Integrated circuit 100 may represent any type of integrated circuit, such as for example a PLD or an application specific integrated circuit. For this exemplary implementation, integrated circuit 100 is shown in FIG. 1 as a PLD, but it should be understood that the various features described herein for one or more embodiments of the present disclosure may be applied to any appropriate product or application employing flash memory.

Integrated circuit 100 includes input/output (I/O) blocks 102, memory blocks 104, and logic blocks 106. I/O blocks 102 represent I/O interfaces for integrated circuit 100. Memory blocks 104 may represent one or more arrays of non-volatile flash memory cells and integrated circuit 100 may further include any other type of memory as may be required by application or specification requirements of integrated circuit 100.

Logic blocks 106 may be optionally included as part of integrated circuit 100 and may represent lookup table logic or logic arrays or any other type of logic as may be required. It should be understood that any number of I/O blocks 102, memory blocks 104, and/or logic blocks 106 may be independently implemented and are not limited in any fashion. Furthermore, memory blocks 104, as well as I/O blocks 102 and/or logic blocks 106 if implemented, may be arranged in any desired fashion within integrated circuit 100.

Figure 2:
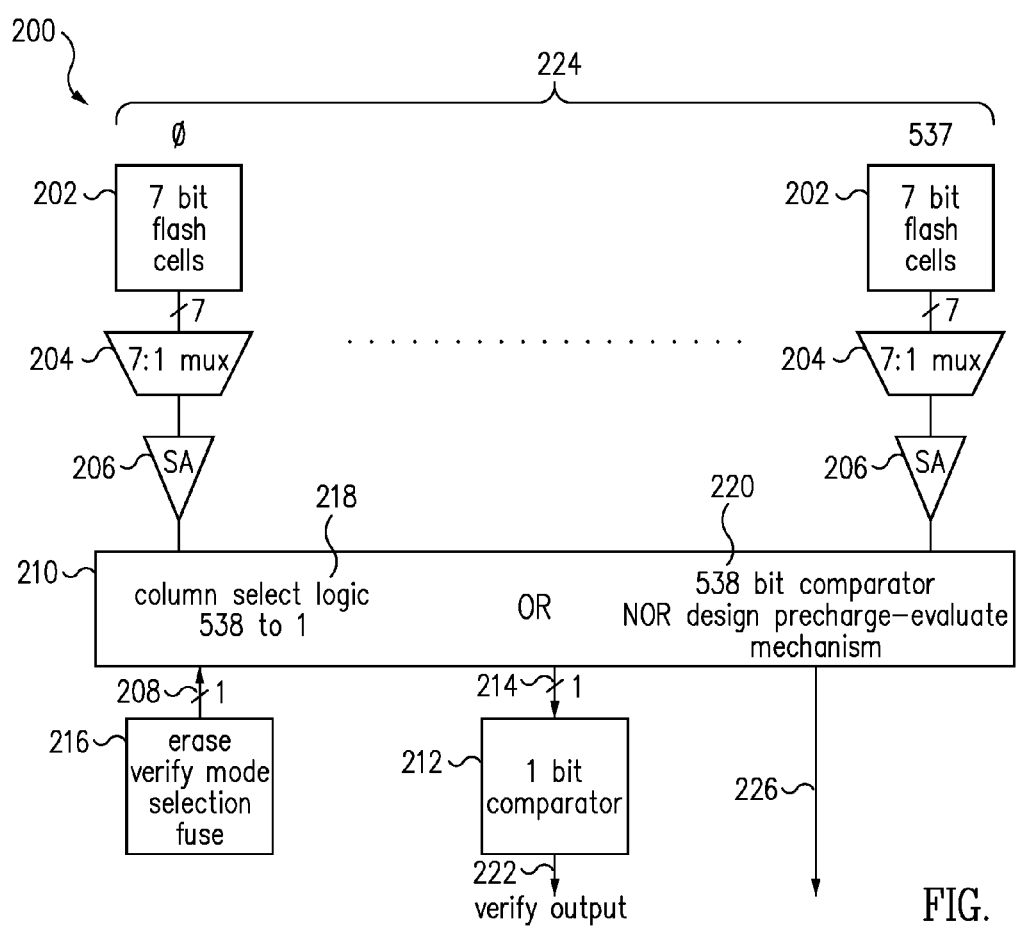
FIG. 2 illustrates a block diagram of an exemplary implementation of a portion of a memory block providing one or more erase verification processes in accordance with an embodiment of the present invention.

FIG. 2 illustrates a block diagram of a circuit 200, which is an exemplary implementation for a portion of one of memory blocks 104 of FIG. 1 in accordance with an embodiment of the present invention. Specifically, circuit 200 shows relevant components utilized by a row-by-row erase verification process in accordance with an embodiment of the present invention. Furthermore, circuit 200 may also provide an optional bit-by-bit erase verification process, with the row-by-row or bit-by-bit erase verification process being selectable, in accordance with an embodiment of the present invention.

Specifically for the row-by-row erase verification, an entire row of flash memory cells, which can include any number of flash memory cells, is taken as an entity. The state of all of the flash memory cells in the selected row can be detected by sense amplifiers at approximately the same time. The detected states can then be collectively processed in accordance with a logic operation (e.g., a logical NOR function of the detected states).

Advantageously, the output of the logic operation (i.e. the NOR function or other type of logic function) can be provided as a single bit that identifies whether any of the flash memory cells of the selected row remain in a programmed state and have not been erased. As a result, the erasure of all of the flash memory cells in an entire row can be verified in parallel.

As an example, the value of each flash memory cell that is in an unprogrammed (erased) state or a programmed (unerased) state can be detected as a "0" value (logical low) and a "1" value (logical high), respectively. Accordingly, when the values of the flash memory cells of an entire row are logically combined by the NOR function, for example, the result of the NOR logic operation will be a "0" value if any of the flash memory cell values are set to an unerased value (i.e., a "1" value). On the other hand, the NOR logic operation will return a "1" value only if all of the detected flash memory cell values are set to an erased "0" value.

If the NOR logic operation returns a "not erased" result (i.e. the NOR result is "0" indicating that at least one flash memory cell in the row is in an unerased state), then appropriate control circuitry of circuit 200 may be employed to re-erase one or more rows of flash memory cells of circuit 200. The verification process can then be repeated for one or more rows of flash memory cells of circuit 200. On the other hand, if the logic operation indicates that the entire selected row of flash memory cells has been properly erased (i.e. the NOR result is "1" indicating that all flash memory cells in the row are in an erased state), then the next row of flash memory cells in circuit 200 is selected and the process continues until all rows of flash memory cells have been verified as being erased.

Counters or other circuitry can be provided for tracking the current bit or row to be verified during a bit-by-bit or row-by-row erase verification process, respectively. For example, during a bit-by-bit verification process, a counter can be incremented after each bit is identified as being fully tested or fully erased. When all bits of a row have been counted, a pulse signal can be provided to indicate that the first bit in the next row should be processed. When an entire row is identified as being fully tested or fully erased during a row-by-row erase verification process, a similar pulse can be provided to indicate that the next row should be processed.

Turning now to the particulars of FIG. 2, circuit 200 includes a plurality of columns 224 with each column including a group of flash memory cells 202, a multiplexer 204, and a sense amplifier 206. Circuit 200 further includes a verification block 210 having column select logic 218 and first logic circuit 220, a select bit 216, a second logic circuit 212, and output signals 222 and 226.

In the embodiment of FIG. 2, each group of flash memory cells 202 includes 7 flash memory cells, with each flash memory cell corresponding to one bit. Accordingly, flash memory cells 202 of circuit 200 collectively provide a 538 bit by 7 bit array of flash memory cells arranged in 7 rows and 538 columns. Although particular numbers of rows and columns have been illustrated in FIG. 2, it will be appreciated that any appropriate number of columns 224 and/or rows of flash memory cells 202 may be used in accordance with the present disclosure.

It will further be appreciated that although particular embodiments of the present invention are described herein with reference to "rows" and "columns," such terms do not limit the scope of available embodiments. For example, the terms "row" and "column" can each refer to an entire row, a portion of a row, an entire column, a portion of a column, and/or any desired plurality of flash memory cells.

Flash memory cells 202 of each column 224 are received by row select logic implemented as 7:1 multiplexers 204, which can be controlled to select particular rows of flash memory cells 202 to be verified. The state of each flash memory cell 202 of the selected row can be detected by the corresponding sense amplifier 206 associated with each column 224.

As discussed, verification block 210 provides column select logic 218 as well as first logic circuit 220. Select bit 216 provides a control signal 208 to verification block 210 to control whether a bit-by-bit erase verification process (using column select logic 218 and second logic circuit 212) or a row-by-row erase verification process (using first logic circuit 220) is performed by verification block 210. In one embodiment, select bit 216 may be provided as a programmable memory cell (e.g. an SRAM configuration flash memory cell), which is programmed during configuration of the PLD.

First logic circuit 220 can be implemented to receive the states of an entire row of flash memory cells 202 (e.g., one flash memory cell from each column 224) from sense amplifiers 206 at approximately the same time. First logic circuit 220 performs a logic operation on the received states to verify that all states of the flash memory cells of the selected row correspond to an erased state. In one embodiment, the logic operation is a NOR operation with first logic circuit 220 being implemented as a 538 bit comparator. The result of the logic operation can be provided as output signal 226.

Column select logic 218 allows individual columns of the plurality of columns 224 to be selected as part of a bit-by-bit erase verification process. Second logic circuit 212 can be implemented as a 1-bit comparator that consecutively receives the states of individual flash memory cells from sense amplifiers 206. Second logic circuit 212 performs a logic operation on each received state to separately verify that the state of each flash memory cell of the array corresponds to an erased state. When bit-by-bit verification is enabled by select bit 216, the result of second logic circuit 212 can be provided as output signal 222.

Figure 3:
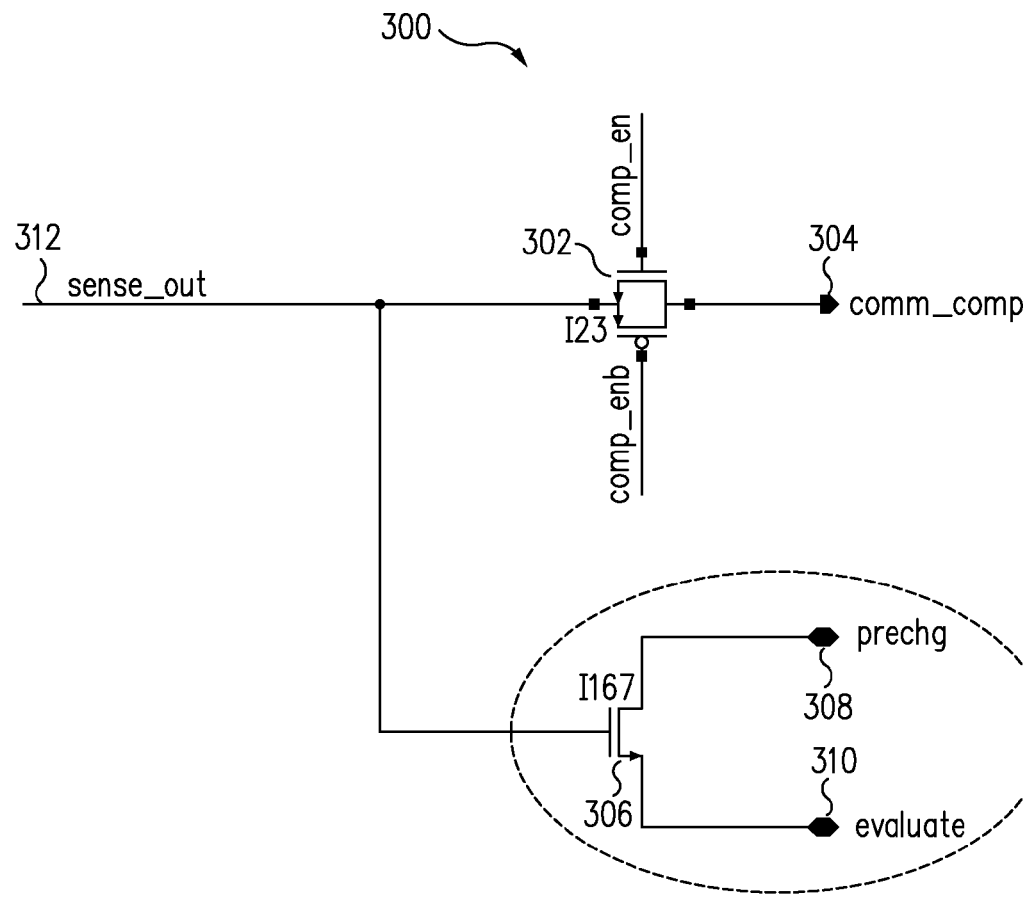
FIG. 3 illustrates an exemplary circuit implementation of a portion of a verification block in accordance with an embodiment of the present invention.

FIG. 3 illustrates a circuit 300, which is an exemplary circuit implementation of a portion of verification block 210 of FIG. 2 in accordance with an embodiment of the present invention. A plurality of circuits 300, for example, may be provided in verification block 210, with each circuit 300 being associated with a corresponding sense amplifier 206. As set forth in FIG. 3, an output signal 312 from each sense amplifier 206 associated with circuit 300 is provided to a transmission gate 302 and the gate of a transistor 306.

Output signal 312 represents the state of a flash memory cell corresponding to a selected row of the array of flash memory cells 202. If the flash memory cell is in an unprogrammed (erased) state, then sense amplifier 206 can provide a logical low value, resulting in output signal 312 providing a low voltage level. Thus, transistor 306 will not be turned on and a precharge line 308 and an evaluate line 310 will remain isolated from each other.

If the flash memory cell is in a programmed (unerased) state, then sense amplifier 206 can provide a logical high value, resulting in output signal 312 providing a high voltage level. In this case, transistor 306 will be turned on and a connection will be formed between precharge line 308 and evaluate line 310.

It will be appreciated that output signal 312 from sense amplifier 206 can be provided to transmission gate 302 and transistor 306 regardless of whether verification block 210 has been configured for row-by-row erase verification or bit-by-bit erase verification. However, in bit-by-bit configurations, transmission gate 302 can be enabled, allowing output signal 312 to pass through as an output signal 304 to second logic circuit 212.

Figure 4:
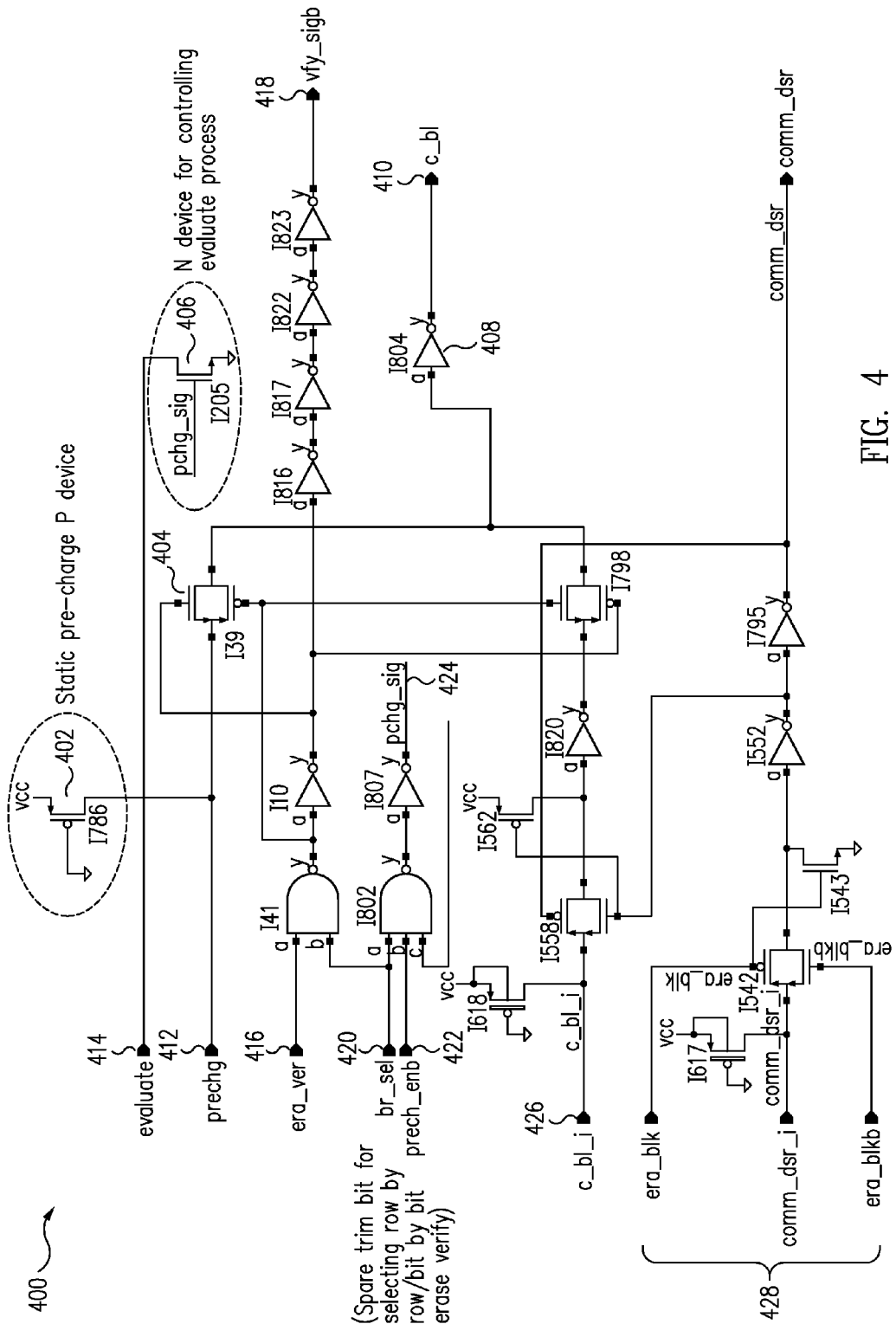
FIG. 4 illustrates an exemplary circuit implementation for providing erase verification signals in accordance with an embodiment of the present invention.

FIG. 4 illustrates a circuit 400, which is an exemplary circuit implementation for providing erase verification signals in accordance with an embodiment of the present invention. A plurality of input signals 412, 414, 416, 420, 422, and 426 are provided as illustrated on the left-hand portion of FIG. 4. Output signals 410 and 418 provide erase verification signals as illustrated on the right-hand portion of FIG. 4. Pullup and pulldown transistors 402 and 406, respectively, are also provided for a precharge line 412 and an evaluate line 414, respectively. FIG. 4 also provides circuitry 428, which is a portion of the circuitry for supporting data readout from data shift registers that have data loaded from flash memory cells 202.

Precharge lines 308 from the plurality of circuits 300 (e.g., implemented within verification block 210) are connected to precharge line 412 of FIG. 4. Similarly, evaluate lines 310 from the plurality of circuits 300 are connected to evaluate line 414 of FIG. 4. Transistor 402 pulls up precharge line 412, while transistor 406 is controlled by a control signal 424 to selectively pull down evaluate line 414.

Input signals 416 and 422 provide signals for enabling an erase verification process for flash memory cells 202. Input signal 420 is used to select between bit-by-bit and row-by-row verification. For example, select bit 216 may provide control signal 208, which is provided as input signal 420 to provide the selection. Furthermore, output signal 222 from second logic circuit 212 may be provided as input signal 426.

Referring now to FIGS. 2, 3, and 4, when row-by-row erase verification is to be performed, select bit 216 can be programmed to provide a logical high ("1") value as input signal 420 of FIG. 4, which is used to logically control and switch on transistor 406. During a row-by-row erase verification process, output signal 312 of each sense amplifier 206 is provided at approximately the same time to a respective circuit 300 associated with each sense amplifier 206. As discussed, when one of sense amplifiers 206 detects the value of a flash memory cell that is in an unprogrammed (erased) state, a "0" value can be provided to the associated transistor 306, causing transistor 306 to remain turned off. As a result, precharge line 308 will remain pulled up by transistor 402. When one of sense amplifiers 206 detects the value of a flash memory cell that is in a programmed (unerased) state, a "1" value can be provided to the associated transistor 306, causing transistor 306 to turn on and causing precharge line 308 to be pulled down.

As discussed, all of precharge lines 308 of the plurality of circuits 300 are connected to precharge line 412 of FIG. 4. As a result, when all of sense amplifiers 206 detect that the flash memory cells of a selected row are in an unprogrammed (erased) state, all of transistors 306 will remain off and precharge line 412 will remain pulled up by transistor 402. However, if at least one of sense amplifiers 206 detects a flash memory cell in a programmed (unerased) state, then transistor 306 of the associated circuit 300 will turn on, thereby causing precharge line 308 of the circuit 300 and consequently precharge line 412 to be pulled down.

Accordingly, it will be appreciated that the signal appearing at precharge line 412 can represent a single bit result of a NOR logic operation performed on the detected states of a selected row of flash memory cells 202. The value of precharge line 412 can then be passed through a transmission gate 404 and an inverter 408 as output signal 410. If the result of the NOR logic operation indicates that all flash memory cells of the selected row are erased, then the next row can be selected for verification. On the other hand, if the NOR logic operation indicates that at least one flash memory cell of the selected row is not erased, one or more blocks of the flash memory cells 202 can be re-erased and the verification process repeated.

When verification block 210 has been configured for bit-by-bit erase verification (for example, when select bit 216 of FIG. 2 has been programmed to select bit-by-bit), output signal 312 for each sense amplifier 206 can be provided sequentially to second logic circuit 212 through an associated transmission gate 302 as output signal 304. Second logic circuit 212 can perform a logic operation on each bit and provide the result of the logic operation as a single bit as input signal 426 of FIG. 4. As illustrated in FIG. 4, input signal 426 may be passed, for example, as output signal 410 (e.g., to appropriate control circuitry for selecting the next flash memory cell or re-erasing flash memory cells 202 as appropriate).

In view of the present disclosure, it will be appreciated that a row-by-row based erase verify approach as set forth herein allows the erasure of multiple flash bits to be verified in parallel. Such an approach can significantly reduce the time required for erase verification of flash memory cells of an array in comparison to previous bit-by-bit verification schemes. It will further be appreciated that the row-by-row approach can be applied to any appropriate technology employing flash memory cells including but not limited to PLDs, standalone memory cards and drives, embedded systems, and other products. Moreover, embodiments providing an optional bit-by-bit erase verification process, with the row-by-row or bit-by-bit erase verification process being selectable, allow for flexibility in the operation of products incorporating such features.

Embodiments described above illustrate but do not limit the invention. For example, although various features have been described with reference to particular bit values, it will be appreciated that implementations utilizing different bit values are also contemplated by the present disclosure. It should also be understood that numerous modifications and variations are possible in accordance with the principles of the present invention. Accordingly, the scope of the invention is defined only by the following claims.

We claim:

1. An integrated circuit comprising:
   an array of flash memory cells arranged in rows and columns;
   a plurality of multiplexers, each multiplexer associated with a column of flash memory cells and adapted to select a flash memory cell from the associated column;
   a plurality of sense amplifiers, each sense amplifier associated with a multiplexer and adapted to detect a state of the selected flash memory cell; and
   a first NOR logic circuit adapted to receive from the sense amplifiers the detected states of a row of selected flash memory cells and perform a first logic operation on the states to verify that all states of selected flash memory cells correspond to an erased state.

2. The integrated circuit of claim 1, further comprising:
   a second logic circuit adapted to sequentially receive the state from each of the sense amplifiers and perform a second logic operation for each selected flash memory cell to verify that all of the states correspond to an erased state.

3. The integrated circuit of claim 1, further comprising:
   a second logic circuit adapted to sequentially receive the state from each of the sense amplifiers and perform a second logic operation for each selected flash memory cell to verify that all of the states correspond to an erased state; and
   a selection circuit adapted to select between a row-by-row erase verification process using the first logic circuit and a bit-by-bit erase verification process using the second logic circuit.

4. The integrated circuit of claim 1, wherein the first logic operation provides a single bit result, with a first value of the bit indicating that the selected flash memory cells are erased and a second value of the bit indicating that at least one of the selected flash memory cells is not erased.

5. The integrated circuit of claim 1, wherein the first logic circuit is a row comparator.

6. The integrated circuit of claim 1, wherein the integrated circuit is a programmable logic device.

7. An integrated circuit comprising:
   an array of flash memory cells arranged in rows and columns;
   means for selecting a row of the flash memory cells;
   means for detecting a state of each flash memory cell in the selected row; and
   means for verifying the detected state of each flash memory cell in the selected row to determine that the states correspond to an erased state.

8. The integrated circuit of claim 7, further comprising means for receiving the state of one of the flash memory cells and verifying that the state of the flash memory cell corresponds to an erased state.

9. The integrated circuit of claim 7, further comprising:
   means for receiving the state of one of the flash memory cells and verifying that the state of the flash memory cell of the array corresponds to an erased state; and
   means for selecting between an erase verification process for the plurality of flash memory cells and an individual flash memory cell erase verification process.

10. The integrated circuit of claim 7, wherein the verifying means provides a single bit result, with a first value of the bit indicating that the selected flash memory cells are erased and a second value of the bit indicating that at least one of the selected flash memory cells is not erased.

11. The integrated circuit of claim 7, wherein the verifying means performs a NOR operation.

12. A method for verifying erasure of a plurality of flash memory cells configured in an array of rows and columns in an integrated circuit, the method comprising:
    selecting a row flash memory cells;
    detecting a state of each flash memory cell in the selected row; and
    verifying in a NOR logic operation that all of the detected states of the flash memory cells in the selected row correspond to an erased state.

13. The method of claim 12, further comprising switching to perform a bit-by-bit erase verification process on the flash memory cells of the array.

14. The method of claim 12, further comprising:
    selecting to perform a bit-by-bit erase verification process, the process comprising:
    receiving the state of each flash memory cell of the array; and
    verifying that each flash memory cell of the array has been erased.

15. The method of claim 12, wherein the verifying step provides a single bit result, with a first value of the bit indicating that the flash memory cells in the selected row are erased and a second value of the bit indicating that at least one of the flash memory cells in the selected row is not erased.

16. The method of claim 12, wherein if the verifying step indicates at least one flash memory cell in the selected row is not erased, the method further comprising:
    performing an erase operation on the flash memory cells in the array; and
    repeating the erasure verification operations.

* * * * *

UNITED STATES PATENT AND TRADEMARK OFFICE
CERTIFICATE OF CORRECTION

| | |
|---|---|
| PATENT NO. | : 7,313,025 B1 |
| APPLICATION NO. | : 11/675246 |
| DATED | : December 25, 2007 |
| INVENTOR(S) | : Hok Wong and Fabiano Fontana |

Page 1 of 1

It is certified that error appears in the above-identified patent and that said Letters Patent is hereby corrected as shown below:

Col. 8, lines 4-6: replace these lines with the following:
　　　--means for verifying, by logically combining the detected states of all flash
　　　　　memory cells in the selected row, whether the detected states
　　　　　correspond to an erased state.--

Col. 8, line 16: change "plurality" to --row--

Signed and Sealed this

First Day of July, 2008

JON W. DUDAS
*Director of the United States Patent and Trademark Office*